United States Patent [19]
Maeda et al.

[11] Patent Number: 5,969,931
[45] Date of Patent: Oct. 19, 1999

[54] INTERFACE STRUCTURE FOR ELECTRONIC APPARATUS

[75] Inventors: Hiromi Maeda; Nobuhiro Izumi; Nobuo Ikeda, all of Kawasaki, Japan

[73] Assignee: Fujitsu Limited, Kanagawa, Japan

[21] Appl. No.: 09/131,606

[22] Filed: Aug. 10, 1998

[30] Foreign Application Priority Data

Mar. 12, 1998 [JP] Japan .................... 10-061410

[51] Int. Cl.⁶ ...................................... H02H 1/00

[52] U.S. Cl. ........................ 361/117; 361/111; 361/119

[58] Field of Search ..................... 361/111, 117, 361/724, 725, 825–828, 56, 118, 119, 127, 18; 211/1.51, 26

[56] References Cited

FOREIGN PATENT DOCUMENTS 63-43399  2/1988  Japan .

*Primary Examiner*—Stephen W. Jackson
*Attorney, Agent, or Firm*—Helfgott & Karas, PC.

[57] ABSTRACT

An electronic apparatus includes a locker having a plurality of shelves, and a plurality of packages 25 are inserted in the respective shelves from the front thereof. Back boards are arranged in the locker at the rear of the shelves. A plurality of back connector boards are attached to the locker from the rear thereof. The connector of the package is plugged-in to the front the connector of the back board, and the connector of the back connector board is plugged-in to the rear connector of the back board. The back connector board also has external line connectors and an interface circuit or other circuits such as a radio interference reducing circuit and a lightning arrester.

10 Claims, 12 Drawing Sheets

5,969,931

INTERFACE STRUCTURE FOR ELECTRONIC APPARATUS

BACKGROUND OF THE INVENTION

1. Field of the Invention

The present invention relates to an interface structure for an electronic apparatus. In particular, the present invention relates to an interface structure, for various electronic apparatuses, with small size and high density and designed to facilitate connecting operations.

2. Description of the Related Art

In recent years, an electronic apparatus such as a communication equipment rarely functions by itself and usually has some electrical connections to other external devices. The method of connection includes various electrical and physical interface conditions, and the number of external line connections per unit device has tended to increase considerably.

As an example of the conventional interface structure of an electronic apparatus such as a communication equipment locker, an telephone exchange or a computer, the arrangement which can realize external connections at the back of the apparatus and connections between the shelves is shown in the perspective view of FIG. 8 and the exploded side view of FIG. 9. As shown in these figures, the communication apparatus comprises a locker 1 and one or a plurality of shelves 2 arranged in the locker 1. The shelf 2 is configured to house a plurality of packages 3, and a back board 4 is mounted to the rear of the shelves 2. The back board 4 has connectors 6 mounted thereto, to which connectors 5 of the packages 3 are fitted. Thus, electrical connection between the packages 3 housed in each shelf 3 is established.

Also, the electrical connection between the shelves 2 is established by cables 8 and connectors 7 arranged on the back of the back board 4 connected to the connectors 6.

For electrical connection to external devices, it is possible to use the cables 8 for inter-shelf connection, but the cables 8 are rarely extended to the outside of the apparatus directly as external lines. This is attributable not only to the problem of the electrical characteristics of the cables but also to the problem of the connection strength of the connectors 6 and 7, a limited number of connections and the connection work. For this reason, a terminal board 9 is arranged on the housing of the locker 1, the terminal board 9 having coaxial cable connectors 10 and signal connectors 11 for external line connection which are connected to the connectors 7 on the back board 4 by special conversion cables 12.

Also, in some cases of the recently-employed external line connection, circuits and connectors are prepared in the apparatus in corresponding to characteristic impedances. As an example of a plurality of kind of connection, as shown in FIG. 8, both the coaxial cable connectors 10 and the signal connectors 11 for external line connection are prepared and one of them is selectively used to adapt the impedance difference of the devices to be connected (other equipments). Also, the packages 3 having two types of circuits are provided, which are selectively used by switching.

The number of external line connections required per apparatus is currently increasing to the range from about 100 channels to about 300 channels. In the conventional method in which the required number of connectors are attached to the back board 4 and connected to the external line connectors on the terminal board 9 by the cables, the allowable number of external line connections is limited to at most 100 channels due to the wiring space or the like.

In addition, a radio interference reduction filter 13 and a lightning arrester 14 are often arranged in the external line interface structure, and the filter 13 and the lightning arrester 14 are conventionally arranged in the package 3 having an interface circuit 15, as shown in FIG. 9.

Further, some apparatuses are arranged to carry out a standby switching operation for failures. To this end, a standby package is arranged in the shelf 2, and the input/output line is switched between the standby package and the operating package in which a failure occurs. A theoretical block diagram with a simplified conventional configuration is schematically shown in FIG. 10.

FIG. 10 shows an 8-to-1 standby switching configuration. When one of packages #0 to #7 develops a failure, the input/output line is switched to the package #8. Realization of this function requires a switching control package 16 capable of switching any lines of packages #0 to #7. This switching control package 16 is arranged in the shelf 2.

The above-mentioned conventional external line connection arrangement includes a measure for meeting the requirements for a plurality of kinds of connections and for the increased number of connections. This conventional arrangement has the following problems: (1) As seen in FIG. 11 showing the rear view of the locker and FIG. 12 showing the side view of the locker, 100 or more external lines may be sometimes required for each shelf 2, resulting not only in an increased cost of equipment and material but in an increased number of wiring operation steps due to the variety of connection forms. (2) In the case of (1) above, the cables from the back board 4 are laid within the locker 1 and connected to the external line connectors 10, 11 on the terminal board 9, and there are a plurality of types of connectors so it is impossible to accommodate more than 100 cables. (3) The radio interference reduction filter 13 is mounted to the package 3, and the noise on the special external line cable 12 is conveyed to the outside, bypassing the filter 13. As a result, there is a possibility that external portions relative to the apparatus are adversely affected. (4) An impedance-switching circuit is required on the package 3, thereby deteriorating the efficiency with which the packages 3 are arranged.

Further, in the circuit to carry out the standby package switching control for failures the switching control package 16 is necessary and the wiring is very difficult since the lines are extended to the switching control package 16 with the increased number of cables on the back board 4, shown in the block diagram of FIG. 10.

SUMMARY OF THE INVENTION

In view of the above-mentioned problems of the prior art, the object of the present invention is to provide an electronic apparatus having an interface structure by which the cost of materials of the apparatus and the number of wiring steps, by utilizing back connector boards, can be reduced, more external lines than those in the prior art can be connected, and measures against radio interferences and lightning can be improved, and at the same time, the size of the apparatus can be minimized.

According to the present invention, there is provided an electronic apparatus comprising: a locker having at least one shelf having a front and a rear; a back board arranged in the locker behind the at least one shelf between said front and said rear and having a first set of connectors on one side thereof and a second set of connectors on the other side thereof, with said second set of connectors electrically connected to said first set of connectors; a plurality of packages inserted in said at least one shelf from said front thereof, each of said packages having a third connector adapted to fit to one of said first set of connectors; and a plurality of back connector boards arranged at said rear of said at least one shelf, each of said back connector board having a fourth connector, a fifth at least one connector and an external line interface circuit arranged between said fourth connector and said fifth at least one connector, with said fourth connector electrically connected to said fifth at least one connector, said fourth connector being adapted to fit to one of said second set of connectors, said fifth at least one connector being adapted to be connected to an external device.

In this arrangement, the back connector boards having line connectors can be mounted to the locker from the rear external thereof, to thereby eliminate the need of the cable connections between the back board and the back connector boards and to reduce the volume required for mounting the external line connectors, with the result that a multiplicity of external lines can be connected to the apparatus.

Preferably, the plurality of back connector boards are arranged parallel to a longitudinal axis of the at least one shelf along which the packages are inserted.

Preferably, the fifth at least one connector of each of the plurality of back connector boards comprises a plurality of connectors.

Preferably, the plurality of back connector boards comprises a plurality of kinds of back connector boards bearing different fifth connectors.

Preferably, the at least one shelf comprises a plurality of shelves, extending parallel to the back connector boards.

Preferably, a radio interference reduction filter and a lightning arrester are arranged in the neighborhood of the fifth at least one connector. This arrangement can suppress all the noise generated before the outlet of the back connector board through the radio interference reduction filter. Also, the ground can be connected to the external line connector boards without allowing the indirect lightning stroke on the external lines to enter the back board or other parts.

Preferably, a standby interface switching circuit arranged on the back connector board is provided. This arrangement eliminates the standby switching board and reduces the wiring on the back board to only an amount required for a single back connector board.

Preferably, there is provided an interface structure for electronic equipment, characterized in that, as shown in FIG. 7, an impedance circuit for the interface circuit is arranged on the back connector board so that the interface condition can be changed by replacing the back connector board. This arrangement makes it possible to change the interface condition simply by replacing the back connector board without changing the interface board (package) removable from the whole shelves.

BRIEF DESCRIPTION OF THE DRAWINGS

The present invention will become more apparent from the following description of the preferred embodiments, with reference to the accompanying drawings, in which.

DESCRIPTION OF THE PREFERRED EMBODIMENTS

Figure 1:
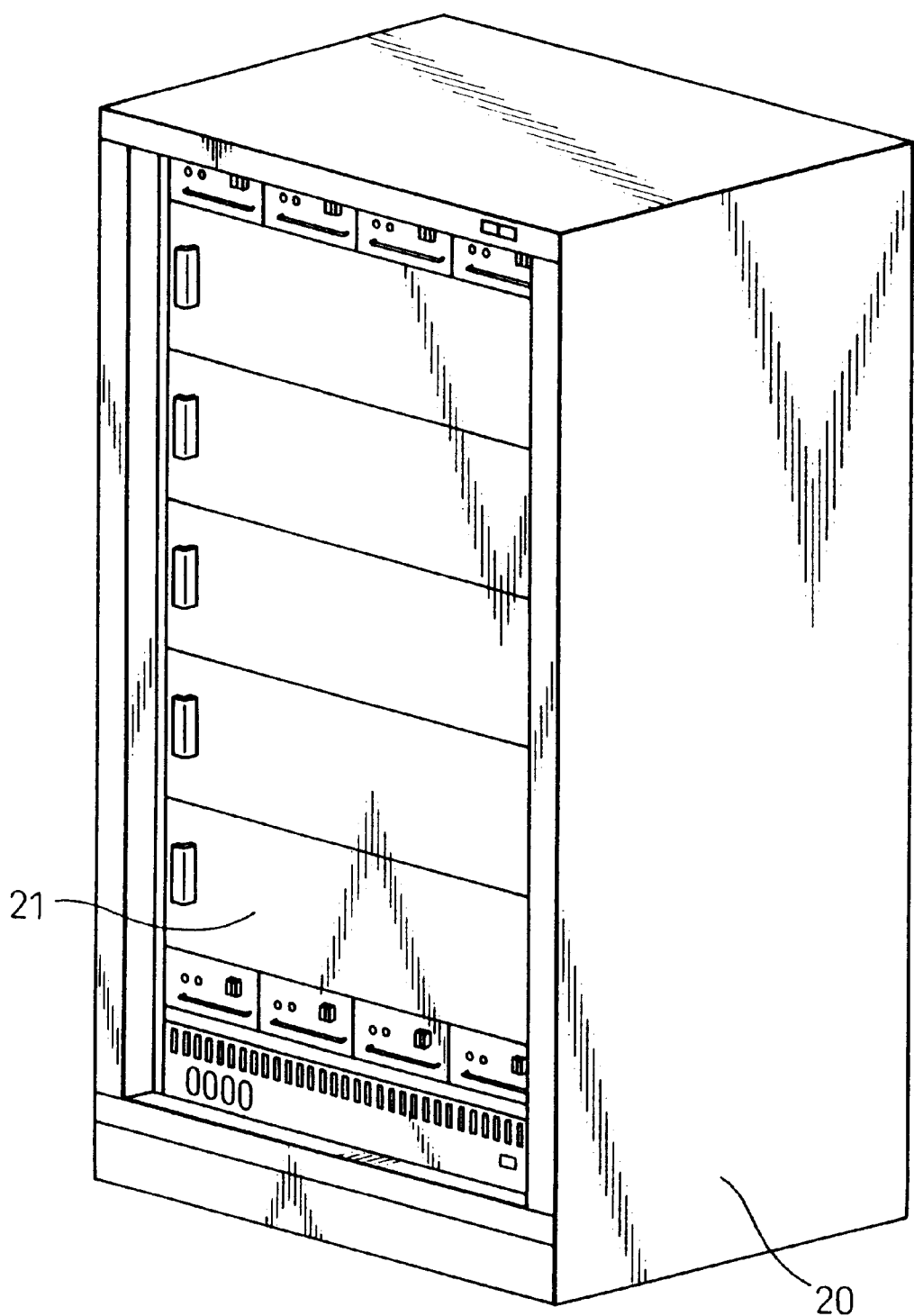
FIG. 1 is a perspective view of a locker of an electronic apparatus according to the embodiment of the invention.
Figure 2:
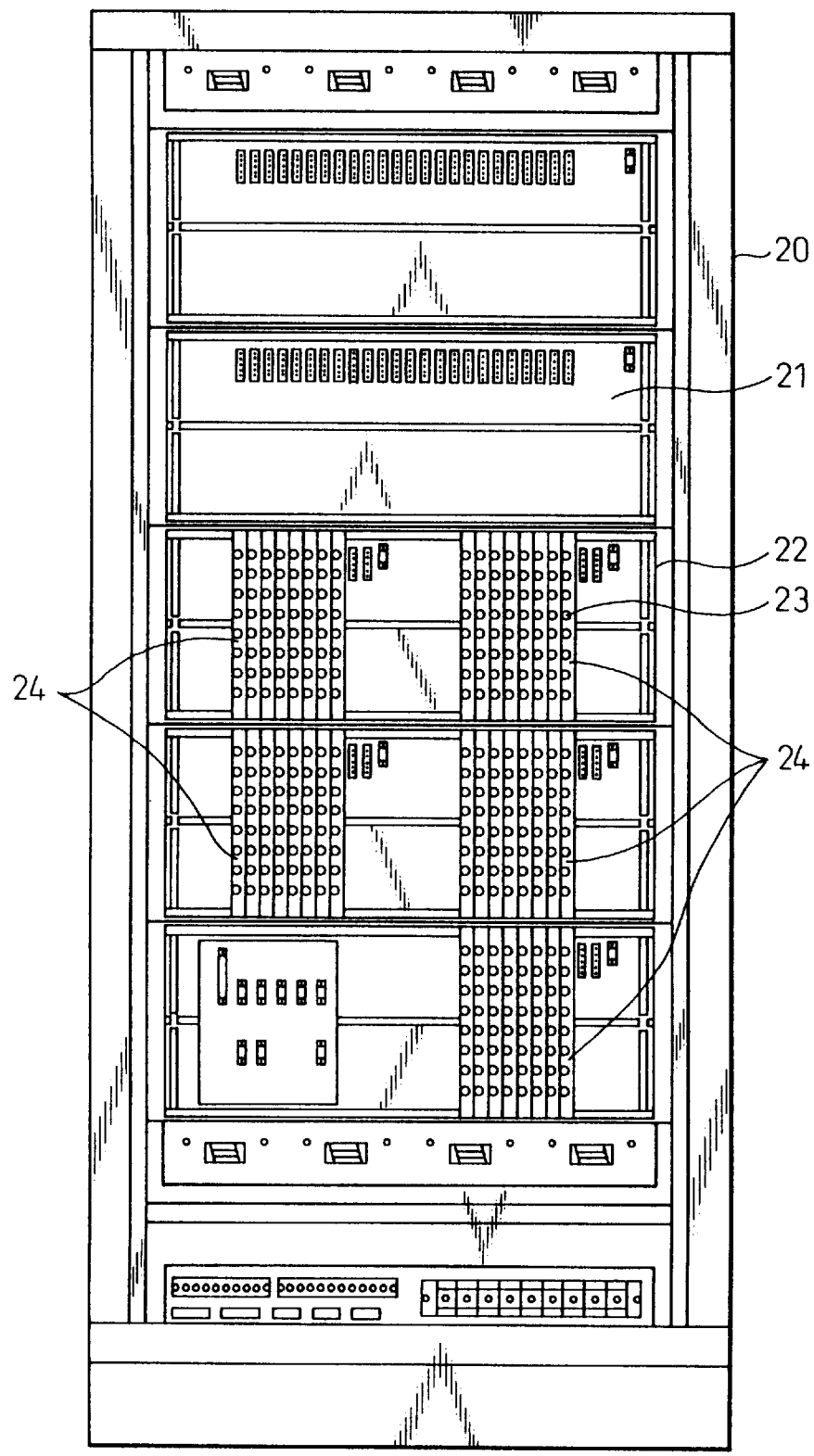
FIG. 2 is a rear view of the locker of FIG. 1.

FIGS. 1 to 4 show the embodiment of the present invention. FIG. 1 shows a locker 20 of an electronic apparatus which houses a plurality of vertical stages (5 stages in the embodiment) of shelves 21. FIG. 2 is a rear view of the locker 20. Back holders 22 are arranged at the rear of the locker 20, corresponding to the respective shelves 21. The back holder 22 removably houses back connector boards 24 each carrying a multiplicity of connectors 23.

Figure 3:
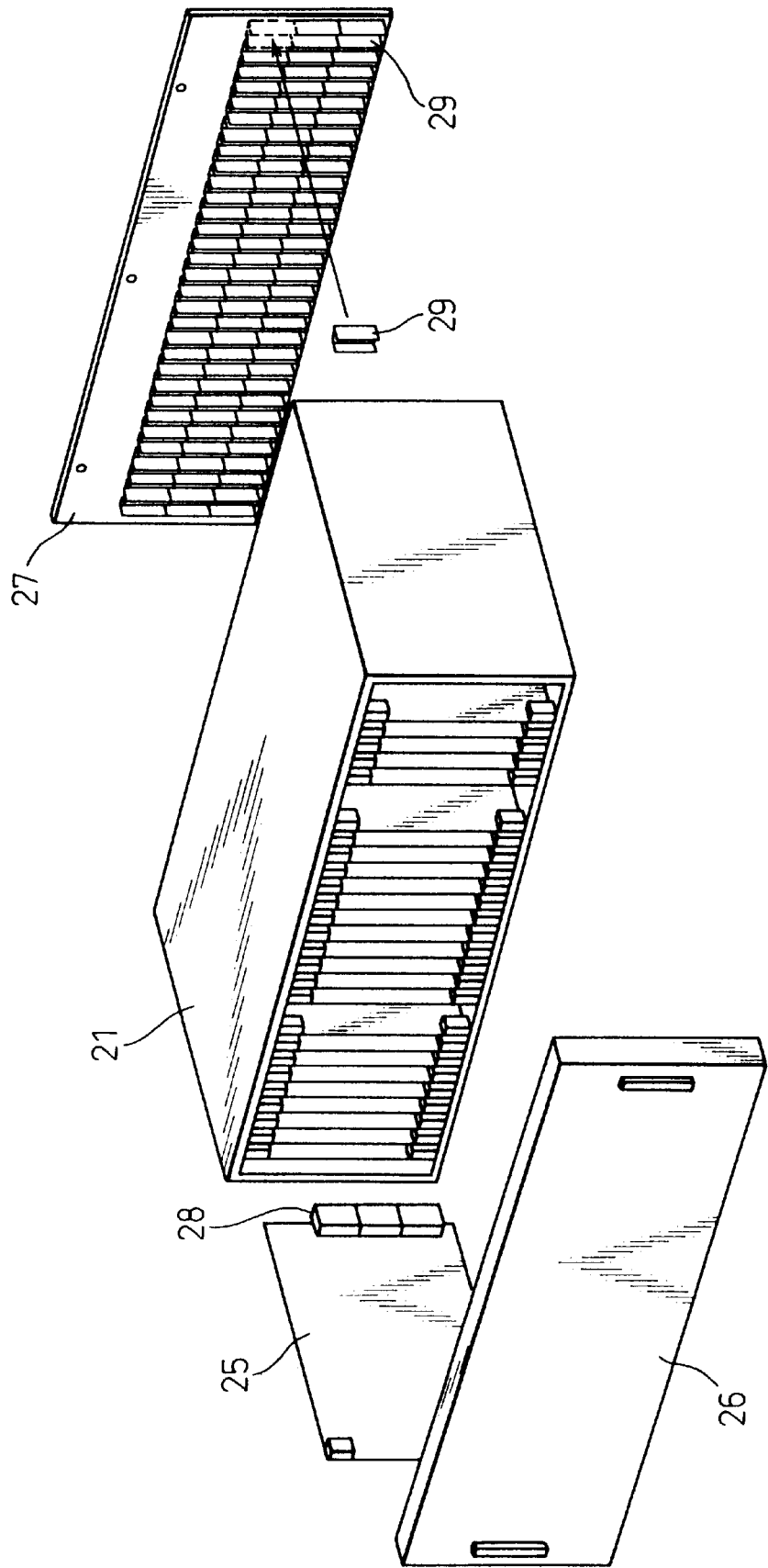
FIG. 3 is an exploded perspective view of the shelf of FIG. 1.

FIG. 3 shows an arrangement of the shelf 21. In this figure 21 designates the shelf having slots or guides to accommodate a multiplicity of packages 25 having connectors 28, and 26 a bonnet covering the front of the shelf 21. Numeral 27 designates a back board arranged in the locker 20 behind the shelf 21. The back board 27 includes a plurality of connectors 29 to which the connectors 28 of the packages 25 can be fitted.

Figure 4:
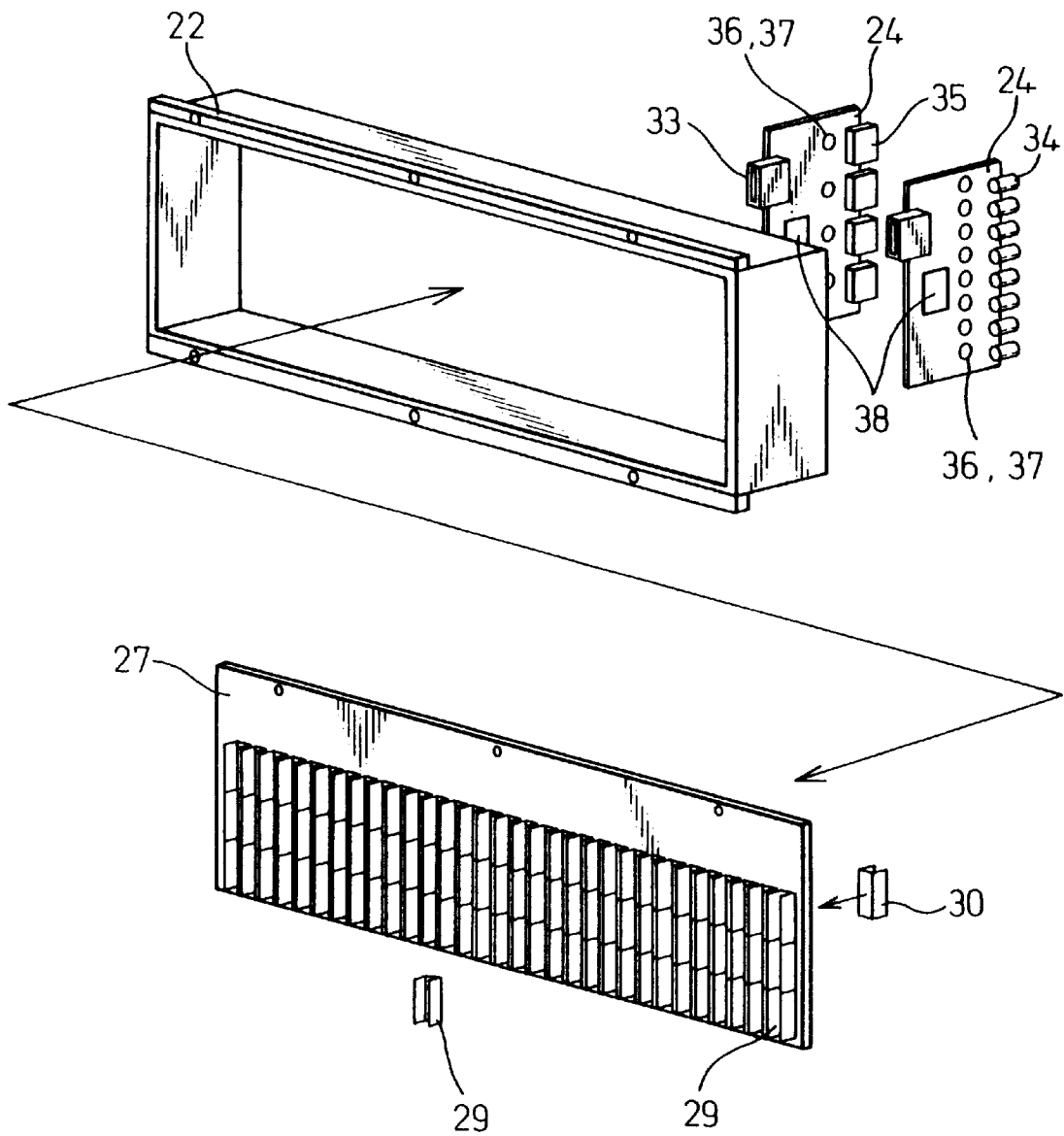
FIG. 4 is an exploded perspective view of the back holder and the back connector board of FIG. 1.
Figure 5E:
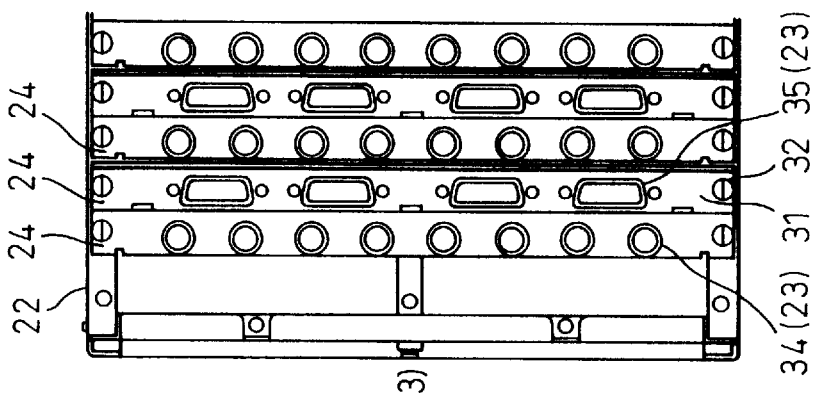
FIG. 5E is a rear view of the back connector boards attached to the back holder.
Figure 5D:
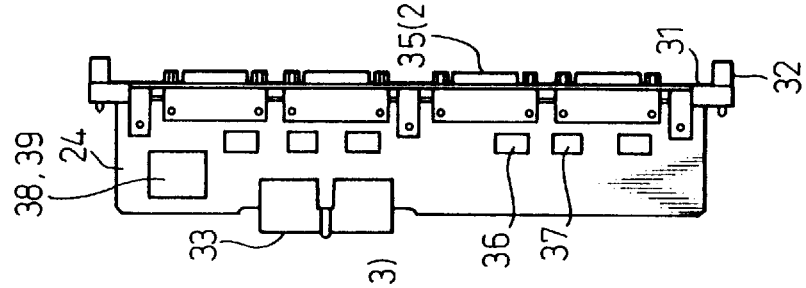
FIG. 5D is a side view of another back connector board.
Figure 5C:
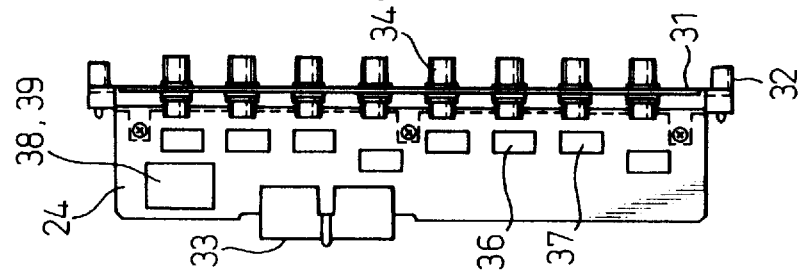
FIG. 5C is a side view of one back connector board.
Figure 5B:
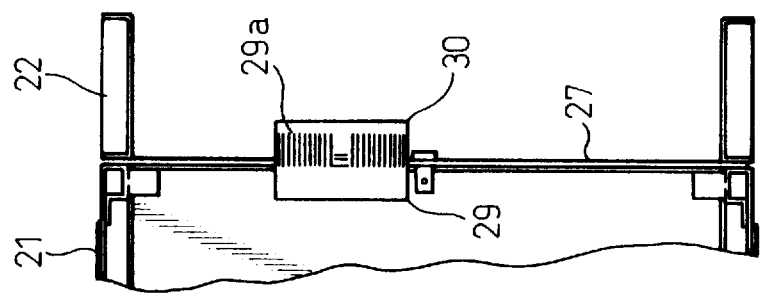
FIG. 5B is a side view of the shelf and the back holder.
Figure 5A:
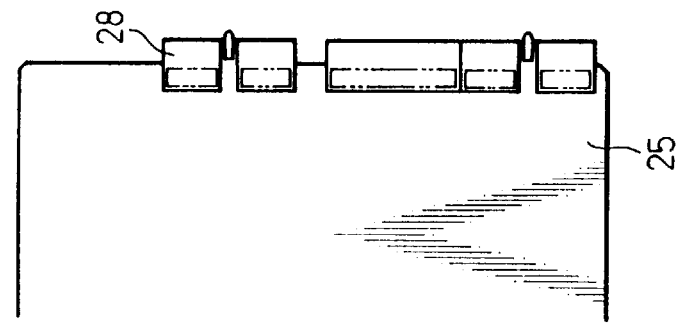
FIG. 5A is a side view of the package.

FIGS. 4 and 5A–5E show the back holder 22 and the back connector boards 24. FIG. 4 is an exploded perspective view of the back board 27, the back holder 22 and back connector boards 24. FIG. 5A shows the package 25, FIG. 5B the shelf 27, the back board 27 and the back holder 22, FIG. 5C one back connector board 24 carrying coaxial cable connectors 34(23), FIG. 5D another back connector board 24 carrying communication connectors 35(23), and FIG. 5E the back connector boards 24 housed in the back holder 22. The back connector has a surface plate 31, and FIG. 5E is a rear view as viewed from the surface plate 31. The shelf 21, the back board 27, the back holder 22, and the back connector boards 24 are arranged in this order.

In FIGS. 4 and 5A–5E, the back holder 22 is in the shape of an annular frame and arranged at the back of the back board 27. A connector 30 is arranged on the rear surface of the back board 27 and is connected to connection pins 29a of the front connector 29. The back connector boards 24 are housed in the back holder 22. The surface plates 31 are attached to the respective back connector boards 24. The ends of the surface plate 31 are fixed to the upper and lower frame portions of the back holder 22 with headed screws 32.

Also, each back connector board 24 has arranged therein a connector 33 to be fitted to the connector 30 on the rear side of the back board 27, and 75-Ω coaxial cable connectors 34(23) and 12-Ω communication connectors 35 for electrical connection to the connector 30 and for electrical connection to external apparatuses. Further, a radio interference reduction filter 36, a lightning arrester 37, an external line interface circuit 38 and its transformer 39 are arranged in the wiring of the back connector board 24 between the connector 33 and the external line connectors 34, 35.

Figure 11:
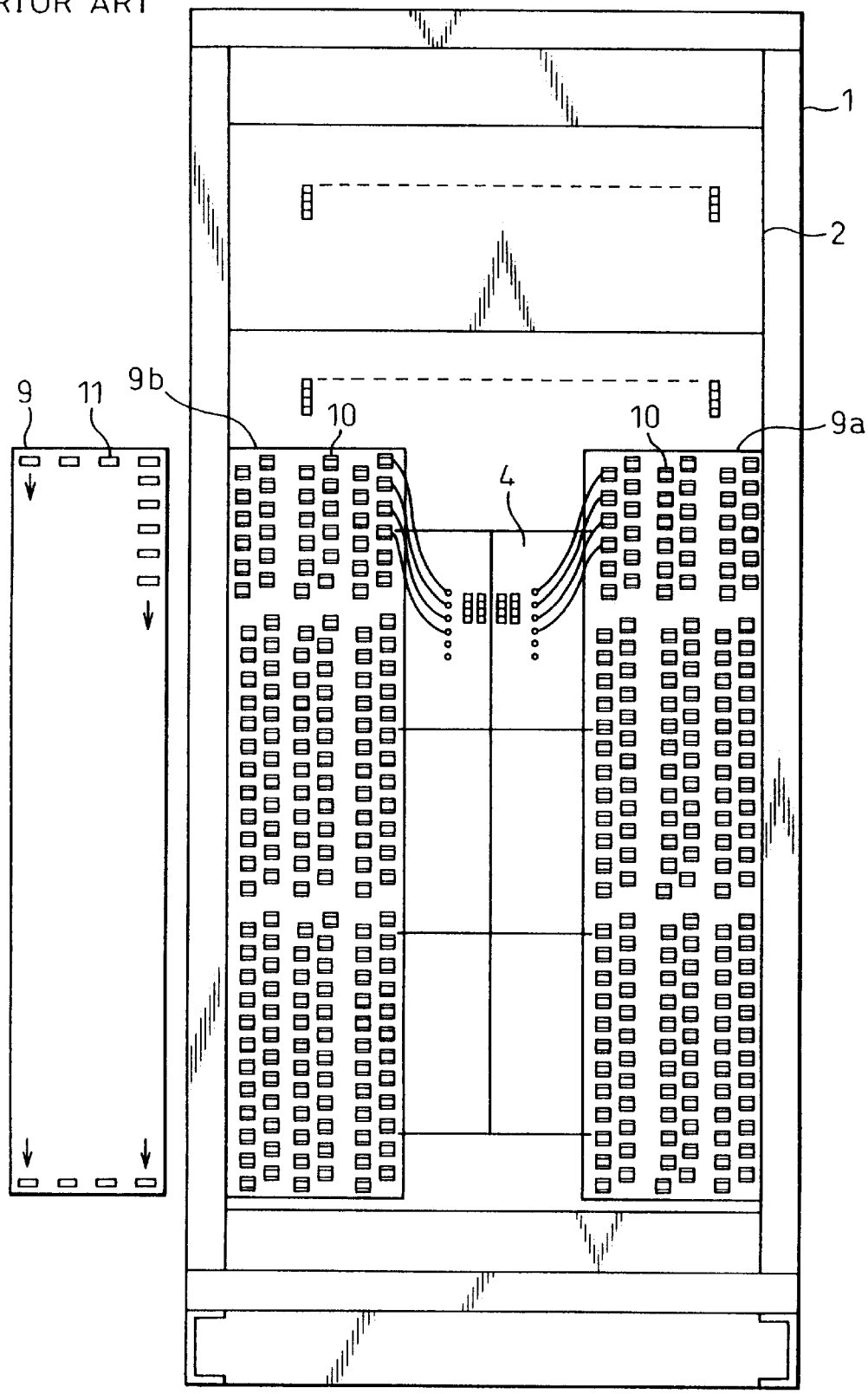
FIG. 11 is a plan view showing a terminal board for an interface structure of the conventional electronic equipment.
Figure 12:
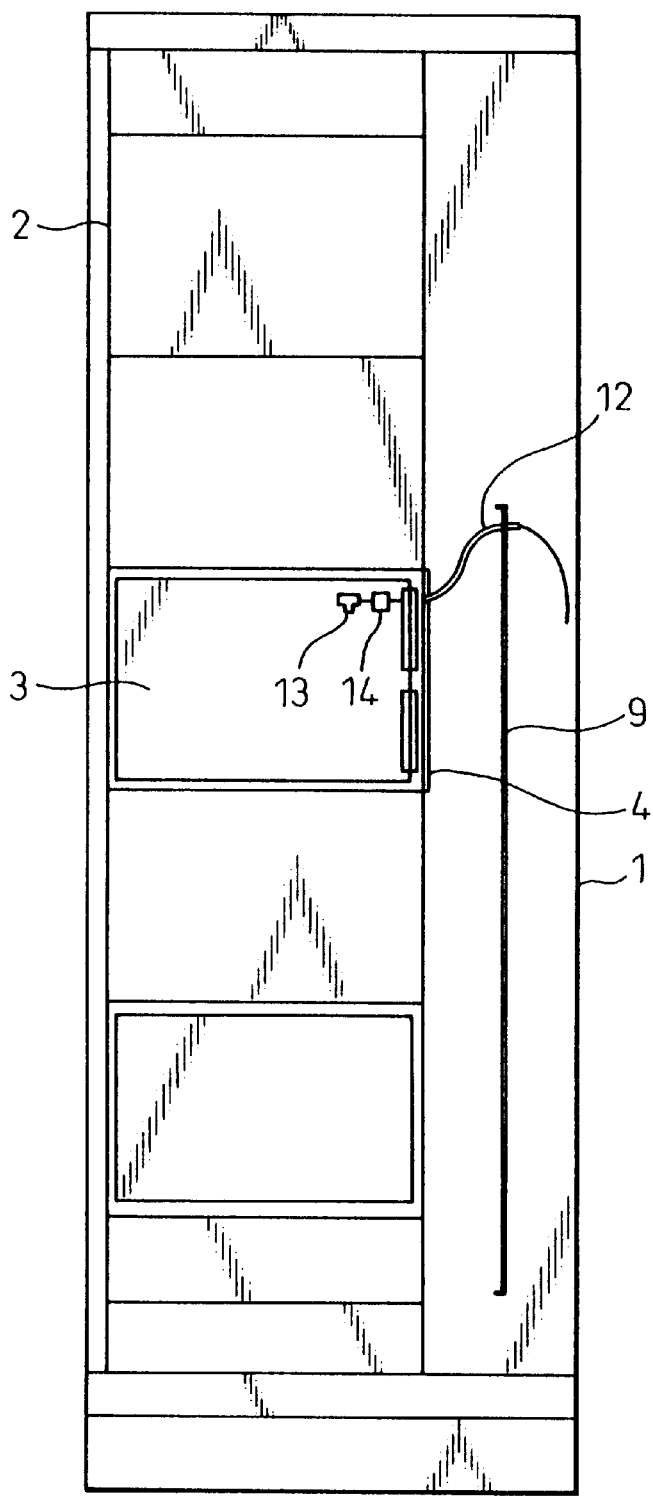
FIG. 12 is a side view showing the terminal board for the interface structure of the conventional electronic equipment.

This embodiment arranged in this manner has the following effects. Specifically, the conventional structure shown in FIGS. 11 and 12 includes five stages of shelves 2 stacked in the locker 1 having the width of 800 mm, and 320 external cables extended from the rear surface of the locker 1. Three back terminal plates 9a and 9b are needed. In the case where 320 coaxial connectors and 160 signal connectors are connected to the back terminal plates 9a and 9b, a sufficient space is required to arrange three terminal plates having the size of about 200×1000 mm side-by-side. However, it is impossible to actually arrange cables and the terminal plates 9a and 9b in the locker 1.

According to this embodiment, in contrast, it is not necessary to arrange cables and thus it is possible to arrange as many connectors as those in the above-mentioned case. Also, cable connections between the back board 27 and the back connector boards 24 can be eliminated, by mounting any one type of the back connector boards 24 having different impedances from the rear side of the locker 20, as shown in FIGS. 2 to 4, and the mounting space of the external line connectors 34 and 35 can be reduced, and therefore a multiplicity of lines can be led at a reduced cost.

Also, this embodiment can provide a measure against radio interference.

Generally, the connection rate of the external line connection signal is 1.5 Mbps, 2 Mbps or 6.3 Mbps, and the radiation noise defined for these bit rates according to the apparatus specification (standards by VCCI, LISPR and FCC) is 30 MHz to 1000 MHz. The external line interface portion is connected to the exterior of the apparatus by cables and as the frequency components of 30 MHz to 100 MHz is carried on the wiring cables, it is radiated out by way of the antenna formed by the cables as a radiation noise. As a means to solve this inconvenience, the radio interference reduction filter 36 is mounted to attenuate the unrequired wave in the band of 30 MHz to 1000 MHz with minimum effect on the main signal.

In the prior art, the radio interference reduction filter is mounted to the package, and the signal line after passing through the radio interference reduction filter runs through the back board and further to the terminal boards. In such case, noise from adjacent patterns or other sources are coupled to the pattern on the back board or to the cables in the locker, and therefore, even after successful removal of the noise component from the main signal by the filter, the re-coupled noise described above is discharged to the outside, and the effect of the filter is thus reduced.

According to this embodiment, on the other hand, as shown in FIGS. 5A to 5E, the signal leaving the package 25 enters the back board 27, and further passes through the radio interference reduction filter 36 immediately before the connector 34 or 35 at the outlet of the back connector board 24. Consequently, all the noise coupled before the outlet of the back connector board 24 can be suppressed by the filter 36. The structure according to this embodiment comprising the lightning arrester 37 can also lead the indirect lightning stroke on the external lines to the earth in the back connector board 24 without allowing it to enter the back board 27 or other parts.

Figure 6:
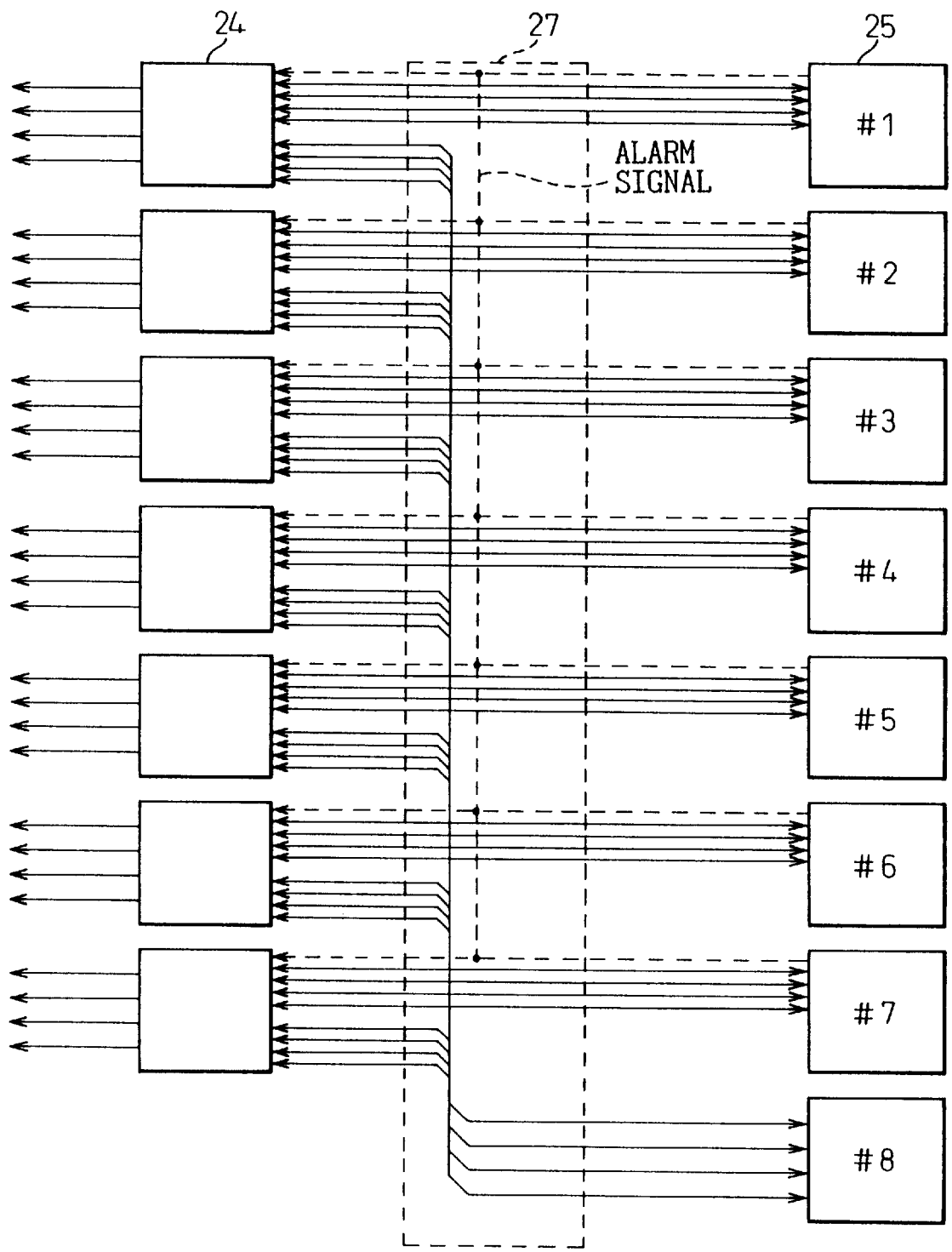
FIG. 6 is a block diagram showing a standby switching circuit according to the embodiment of the invention.

FIG. 6 is a block diagram showing the arrangement of a standby switching circuit according to the embodiment of the present invention. The standby switching circuit includes a switching relay mounted to each back connector board 24 which is mounted to the back board 27 from the rear surface thereof, and the back connector boards 24 are switched by an alarm (switching signal) introduced into a back connector board 24. According to the prior art, this switching function is performed on the standby switching board.

A plurality of lines would be undesirably switched to a standby system in the case where alarm switching occurs for a plurality of packages. In view of this, according to this embodiment, the control is carried out such that each back connector board 24 exchanges an exclusive control signal at the same time as the alarm signal and notifies the occurrence of the first switching operation to the other back connector boards 24, so that any further switching operation is not performed. The switching system with these circuits shown in this block diagram eliminates both the need of the standby switching board and the wiring on the back board can be established by that on the single back connector board.

Figure 7:
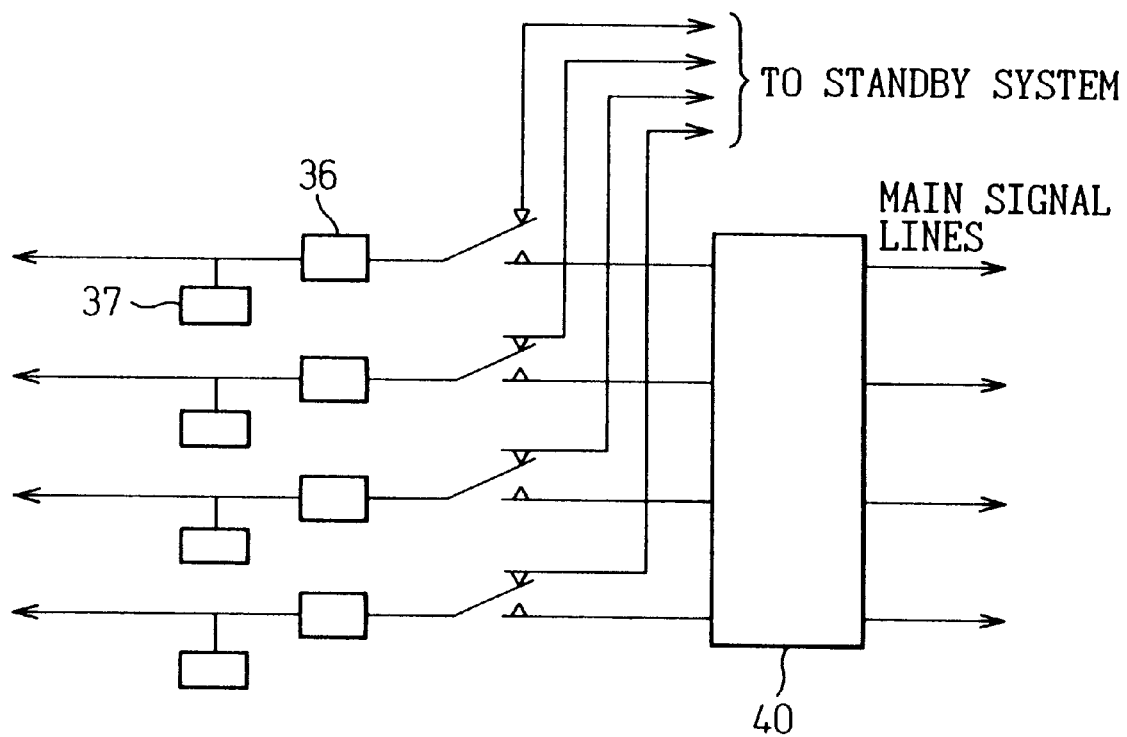
FIG. 7 is a circuit diagram of the back connector board according to the embodiment of the invention.
Figure 8:
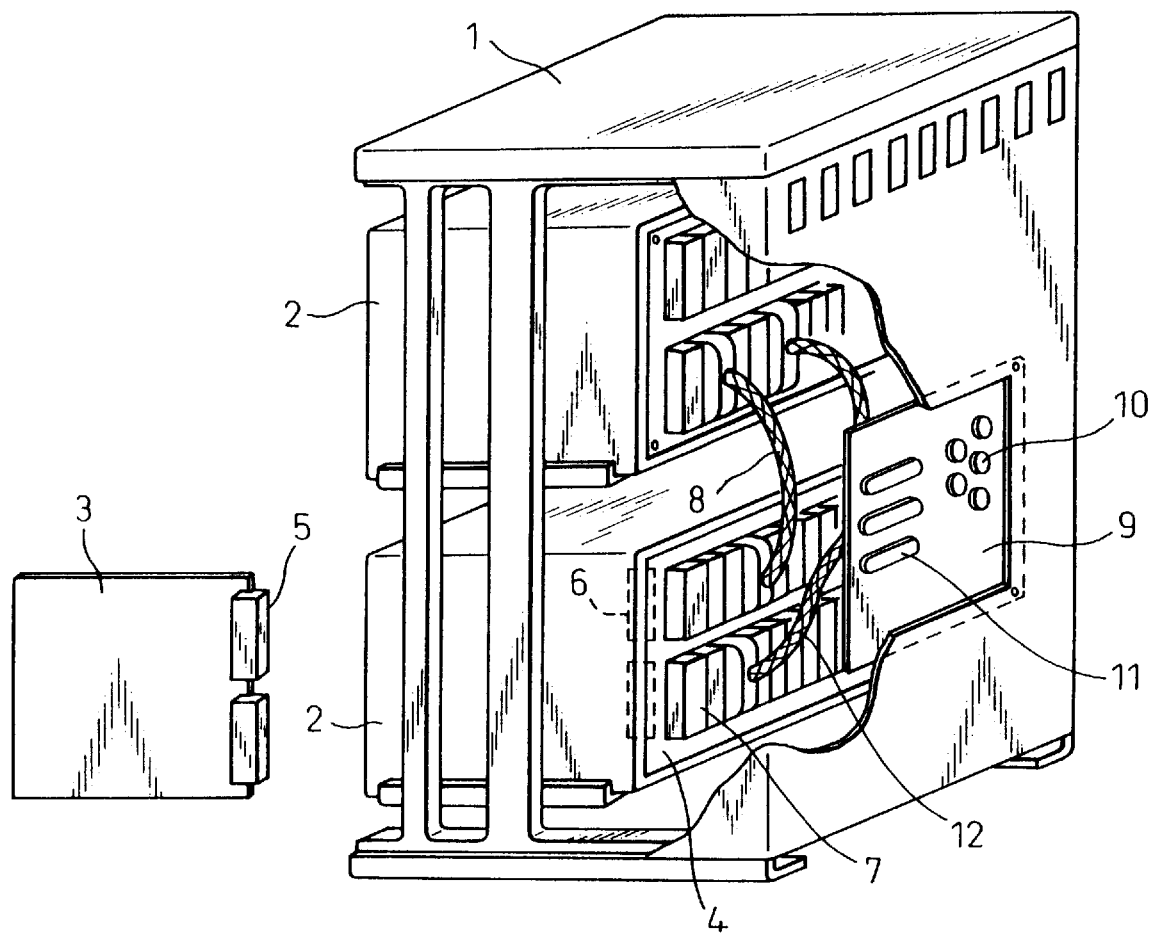
FIG. 8 is a perspective view of the arrangement for realizing the connection of external lines on the rear of the apparatus and the connection between the shelves as an example of an interface structure of a conventional electronic equipment.
Figure 9:
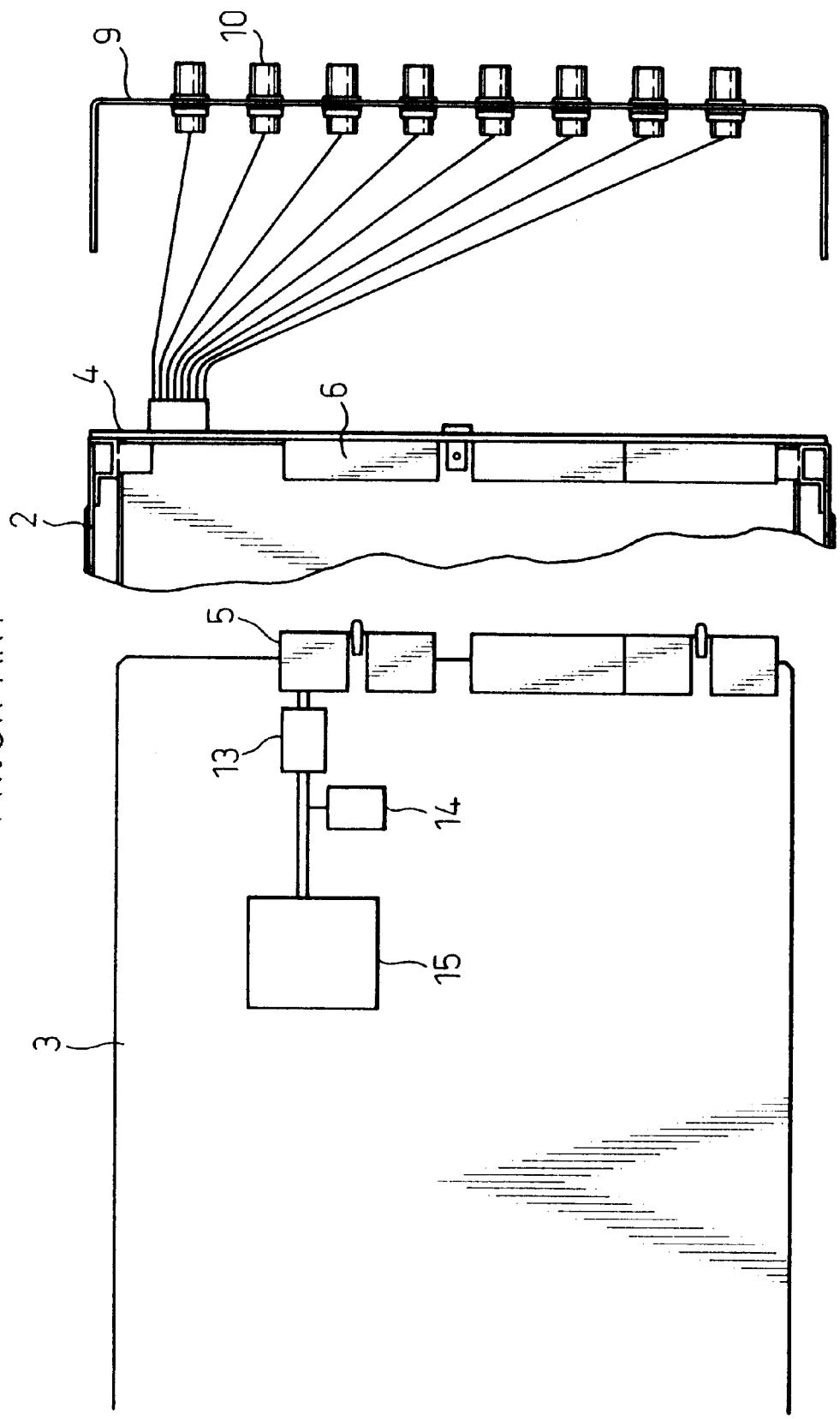
FIG. 9 is a side view of the arrangement for realizing the connection of the external lines on the rear of the apparatus and the connection between the shelves as an example of the interface structure of the conventional electronic equipment.
Figure 10:
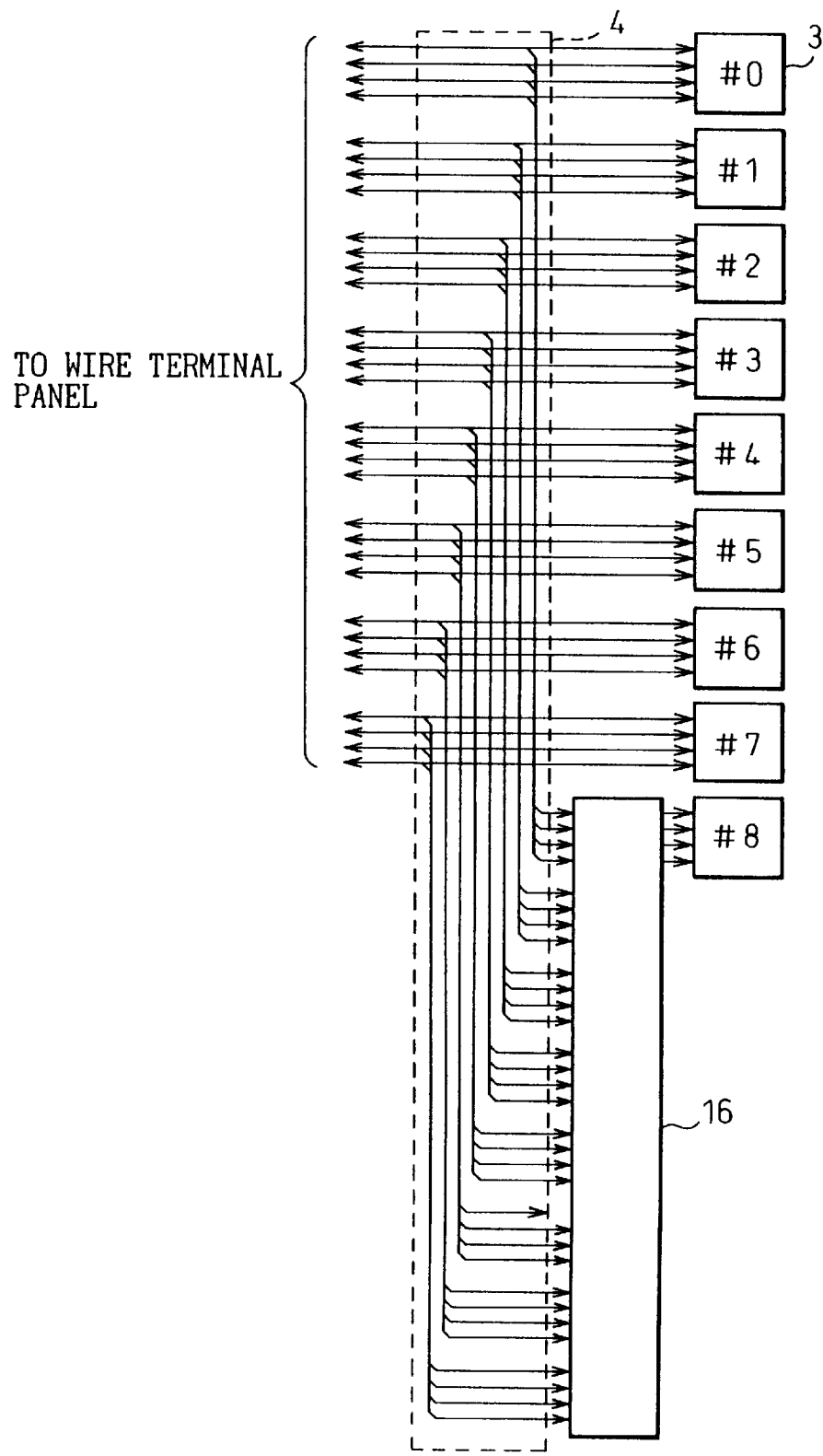
FIG. 10 is a block diagram showing a standby switching circuit for the interface structure of the conventional electronic equipment.

According to this embodiment, as shown in FIG. 7, a transformer coupler circuit 40 for changing the characteristic impedance is also placed on the back connector board 24. By arranging the circuit conforming with the characteristic on the back connector board 24 in this way, a plurality of interface circuits can be handled simply by replacing the back connector boards 24 without changing the circuit of the package 25.

According to this invention, the need of the external line terminal boards is eliminated, so the cable wiring between the back board and the terminal board is eliminated. As a result, less space is required for the external line connectors and more than 100 external line connections can be realized. Also, the radio interference reduction filter and the lightning arrester mounted on the back connector board improves the radiation noise characteristic and minimizes the effect of the lightning surge.

The elimination of the switching control board hitherto required for a standby system circuit configuration reduces the wiring on the back board. Also, the transformer coupler placed on the back connector board makes it possible to change the interface condition simply by replacing the back connector board.

As described above, the cost of wiring materials and the number of wiring steps for the apparatus can be reduced. Further, the space for the external line connectors can be reduced, resulting in a smaller size of the equipment. Also, the effective arrangement of the radio interference reduction filter and the lightning arrester and the simplification of the switching system circuit contributes to an efficient packaging design of a communication equipment.

We claim:

1. An electronic apparatus, comprising:
   a locker having at least one shelf, a front and a rear;
   a back board arranged in said locker behind said at least one shelf and having a first set of connectors on one side thereof and a second set of connectors on the other side thereof, with said second set of connectors electrically connected to said first set of connectors;

a plurality of packages inserted in said at least one shelf from said front thereof, each of said packages having a third connector adapted to fit to one of said first set of connectors; and a plurality of back connector boards arranged at said rear of said at least one shelf, each of said back connector board having a fourth connector, a fifth set of connectors and an external line interface circuit arranged between said fourth connector and said fifth set of connectors, with said fourth connector electrically connected to said fifth set of connectors, said fourth connector being adapted to fit to one of said second set of connectors, said fifth set of connectors being adapted to be connected to an external device.

2. An electronic apparatus according to claim 1, further comprising a filter for reducing radio interference and a lightning arrester arranged on said back connector boards in the neighborhood of fifth at least one connector.

3. An electronic apparatus according to claim 1, further comprising a standby switching circuit arranged on said back connector boards.

4. An electronic apparatus according to claim 1, further comprising an impedance circuit of the interface circuit arranged on said back connector board, so that the interface condition can be changed by replacing said back connector board.

5. The electronic apparatus of claim 1, wherein said rear of said shelf includes an opening enabling said back connector boards to be removed.

6. The electronic apparatus of claim 1, wherein said back connector boards include a surface plate attached to said fifth set of connectors.

7. An electronic apparatus according to claim 1, characterized in that said plurality of back connector boards are arranged parallel to a longitudinal axis of said at least one shelf along which said packages are inserted.

8. An electronic apparatus according to claim 7, characterized in that said plurality of back connector boards comprises a plurality of kinds of back connector boards bearing different fifth connectors.

9. An electronic apparatus according to claim 8, further comprising at least one back holder mounted to said locker so that said plurality of back connector boards can be attached to said at least one back holder.

10. An electronic apparatus according to claim 9, characterized in that said at least one shelf comprises a plurality of shelves, and said at least one back holder comprises a plurality of back holders arranged for every shelf.

* * * * *